United States Patent
Ren et al.

(10) Patent No.: US 12,048,205 B2
(45) Date of Patent: Jul. 23, 2024

(54) DISPLAY SUBSTRATE, METHOD FOR PREPARING SAME, DISPLAY PANEL, AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Wenming Ren, Beijing (CN); Feifei Zhu, Beijing (CN); Wenbin Jia, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 204 days.

(21) Appl. No.: 17/520,477

(22) Filed: Nov. 5, 2021

(65) Prior Publication Data
US 2022/0149130 A1    May 12, 2022

(30) Foreign Application Priority Data
Nov. 10, 2020   (CN) .......................... 202011247035.7

(51) Int. Cl.
*H01L 27/32*   (2006.01)
*H01L 51/56*   (2006.01)
*H10K 59/124*  (2023.01)
*H10K 71/00*   (2023.01)
*H10K 59/12*   (2023.01)

(52) U.S. Cl.
CPC .......... *H10K 59/124* (2023.02); *H10K 71/00* (2023.02); *H10K 59/1201* (2023.02)

(58) Field of Classification Search
CPC .................................................... H10K 59/124
See application file for complete search history.

(56) References Cited

U.S. PATENT DOCUMENTS

| | | | | |
|---|---|---|---|---|
| 10,756,151 | B2 * | 8/2020 | Jia | H10K 59/124 |
| 2014/0367669 | A1 * | 12/2014 | Takeuchi | H10K 59/122 |
| | | | | 438/34 |
| 2018/0076047 | A1 * | 3/2018 | Tanaka | H01L 21/76 |
| 2019/0103452 | A1 * | 4/2019 | Jia | H10K 59/124 |
| 2021/0126057 | A1 * | 4/2021 | Seo | H10K 50/844 |
| 2022/0320210 | A1 * | 10/2022 | Tang | H10K 71/135 |

* cited by examiner

*Primary Examiner* — Victoria K. Hall
(74) *Attorney, Agent, or Firm* — IPro, PLLC

(57) ABSTRACT

Provided is a display substrate. The display substrate includes a base substrate, a patterned film disposed on a side of the base substrate, and a planarization film disposed on a side, distal from the base substrate, of the patterned film, wherein a surface, distal from the base substrate, of the patterned film has a depressed portion and a non-depressed portion. A thickness of the depressed portion is less than a thickness of the non-depressed portion, and lyophilicity of the depressed portion is higher than the lyophilicity of the non-depressed portion.

20 Claims, 15 Drawing Sheets

DISPLAY SUBSTRATE, METHOD FOR PREPARING SAME, DISPLAY PANEL, AND DISPLAY DEVICE

CROSS-REFERENCE TO RELATED APPLICATION

This application claims priority to the Chinese Patent Application No. 202011247035.7, filed on Nov. 10, 2020 and entitled "DISPLAY SUBSTRATE, METHOD FOR PREPARING SAME, DISPLAY PANEL, AND DISPLAY DEVICE," the disclosure of which is incorporated herein by reference in its entirety.

TECHNICAL FIELD

The present disclosure relates to the field of display technologies, and in particular relates to a display substrate, a method for preparing the same, a display panel, and a display device.

BACKGROUND

Currently, with the rapid development of science and technology, various display devices are being gradually developed, including liquid crystal display (LCD) devices, and an organic light-emitting diode (OLED) display devices, and the like.

In the related art, the display device may include a base substrate, a thin film transistor disposed on a side of the base substrate, and a planarization layer. The planarization layer is configured to planarize a side, distal from the base substrate, of the thin film transistor.

SUMMARY

Embodiments of the present disclosure provide a display substrate, a method for preparing the same, a display panel, and a display device.

According to one aspect of the embodiments of the present disclosure, a display substrate is provided.

The display substrate includes: a base substrate; a patterned film disposed on a side of the base substrate, wherein a surface, distal from the base substrate, of the patterned film is provided with a depressed portion and a non-depressed portion, a thickness of the depressed portion being less than a thickness of the non-depressed portion; and a planarization film disposed on a side, distal from the base substrate, of the patterned film; wherein lyophilicity of the depressed portion is higher than lyophilicity of the non-depressed portion.

In some embodiments, the planarization film includes a first planarization layer and a second planarization layer that are sequentially laminated in a direction going away from the patterned film; the first planarization layer is disposed in the depressed portion; an orthographic projection of the first planarization layer on the base substrate is not overlapped with an orthographic projection of the non-depressed portion on the base substrate; and a thickness of the first planarization layer is not greater than a depth of the depressed portion, and an orthographic projection of the second planarization layer on the base substrate is overlapped with the orthographic projection of the non-depressed portion on the base substrate, and is overlapped with an orthographic projection of the depressed portion on the base substrate; wherein lyophilicity of the first planarization layer is higher than lyophilicity of the second planarization layer.

In some embodiments, flatness of a surface, distal from the first planarization layer, of the second planarization layer is greater than flatness of a surface, distal from the base substrate, of the patterned film.

In some embodiments, the display substrate further includes a lyophobic layer, wherein the lyophobic layer is disposed between the non-depressed portion and the planarization film.

In some embodiments, the display substrate further includes a first electrode layer, a light-emitting layer, and a second electrode layer; wherein the light-emitting layer emits light under driving of the first electrode layer and the second electrode layer.

In some embodiments, the display substrate further includes a pixel define layer disposed on a side, distal from the base substrate, of the first electrode layer; wherein the pixel define layer includes a hollowed-out area, wherein the hollowed-out area exposes at least part of the first electrode layer; and the light-emitting layer is disposed in the hollowed-out area, and is in contact with the first electrode layer.

According to another aspect of the embodiments of the present disclosure, a method for preparing a display substrate is provided.

The method includes: forming a patterned film on a side of a base substrate, wherein a surface, distal from the base substrate, of the patterned film has a depressed portion and a non-depressed portion, and a thickness of the depressed portion is less than a thickness of the non-depressed portion; and forming a planarization film on a side, distal from the base substrate of the patterned film; wherein lyophilicity of the depressed portion is higher than lyophilicity of the non-depressed portion.

In some embodiments, forming the planarization film on the side, distal from the base substrate, of the patterned film includes: forming a first planarization layer in the depressed portion, wherein an orthographic projection of the first planarization layer on the base substrate is not overlapped with an orthographic projection of the non-depressed portion on the base substrate, and a thickness of the first planarization layer is not greater than a depth of the depressed portion; and forming a second planarization layer on a side, distal from the patterned film, of the first planarization layer, wherein an orthographic projection of the second planarization layer on the base substrate is overlapped with the orthographic projection of the non-depressed portion on the base substrate, and is overlapped with an orthographic projection of the depressed portion on the base substrate; wherein lyophilicity of the first planarization layer is higher than lyophilicity of the second planarization layer.

In some embodiments, flatness of a surface of the second planarization layer distal from the first planarization layer is greater than flatness of a surface, distal from the base substrate, of the patterned film.

In some embodiments, forming the first planarization layer in the depressed portion includes: forming a first planarization thin film on the surface, distal from the base substrate, of the patterned film; acquiring a dried first planarization thin film by drying the first planarization thin film; and acquiring the first planarization layer by removing the dried first planarization thin film on the non-depressed portion and retaining at least part of the dried first planarization thin film in the depressed portion.

In some embodiments, forming the first planarization thin film on the surface, distal from the base substrate, of the patterned film includes: forming the first planarization thin film on the surface, distal from the base substrate, of the patterned film by slit coating, spin coating, or spray coating.

In some embodiments, forming the first planarization layer in the depressed portion includes: forming a first planarization thin film in the depressed portion; and acquiring the first planarization layer by drying the first planarization thin film.

In some embodiments, forming the first planarization thin film in the depressed portion includes: forming the first planarization thin film in the depressed portion by printing.

In some embodiments, forming the second planarization layer on the side, distal from the patterned film, of the first planarization layer includes: forming a second planarization thin film on the side, distal from the patterned film, of the first planarization layer, wherein an orthographic projection of the second planarization thin film on the base substrate is overlapped with the orthographic projection of the non-depressed portion on the base substrate, and is overlapped with the orthographic projection of the depressed portion on the base substrate; and acquiring the second planarization layer by drying the second planarization thin film.

In some embodiments, forming the second planarization thin film on the side, distal from the patterned film, of the first planarization layer includes: forming the second planarization thin film on a surface, distal from the patterned film, of the first planarization layer by slit coating, spin coating, or spray coating.

In some embodiments, prior to forming the planarization film on the side, distal from the base substrate, of the patterned film, the method further includes: forming a lyophobic layer on a surface, distal from the base substrate, of the non-depressed portion.

In some embodiments, upon forming the planarization film on the side, distal from the base substrate, of the patterned film, the method further includes: sequentially forming a first electrode layer, a light-emitting layer, and a second electrode layer on a side, distal from the patterned film, of the planarization film, wherein the light-emitting layer emits light under driving of the first electrode layer and the second electrode layer.

In some embodiments, upon forming the first electrode layer, the method further includes: forming a pixel define layer on a side, distal from the planarization film, of the first electrode layer; wherein the pixel define layer includes a hollowed-out area, wherein the hollowed-out area exposes at least part of the first electrode layer; and the light-emitting layer is disposed in the hollowed-out area, and is in contact with the first electrode layer.

According to still another aspect of the embodiments of the present disclosure, a display panel is provided. The display panel includes a drive circuit and a display substrate, wherein the drive circuit is configured to provide a drive signal for a sub-pixel in the display substrate.

The display substrate includes: a base substrate; a patterned film disposed on a side of the base substrate, wherein a surface, distal from the base substrate, of the patterned film has a depressed portion and a non-depressed portion, a thickness of the depressed portion being less than a thickness of the non-depressed portion; and a planarization film disposed on a side, distal from the base substrate, of the patterned film; wherein lyophilicity of the depressed portion is higher than lyophilicity of the non-depressed portion.

According to still yet another aspect of the embodiments of the present disclosure, a display device is provided. The display device includes a power supply and the display panel according to the above aspects, wherein the power supply is configured to supply power to the display panel.

BRIEF DESCRIPTION OF THE DRAWINGS

The foregoing and other objectives, features, and advantages of exemplary embodiments of the present disclosure are easier to understand by referring to the following detailed description with reference to the accompanying drawings. In the accompanying drawings, several embodiments of the present disclosure are illustrated in an exemplary rather than restrictive fashion; and the same or corresponding reference numerals represent the same or corresponding components.

Figure 1:
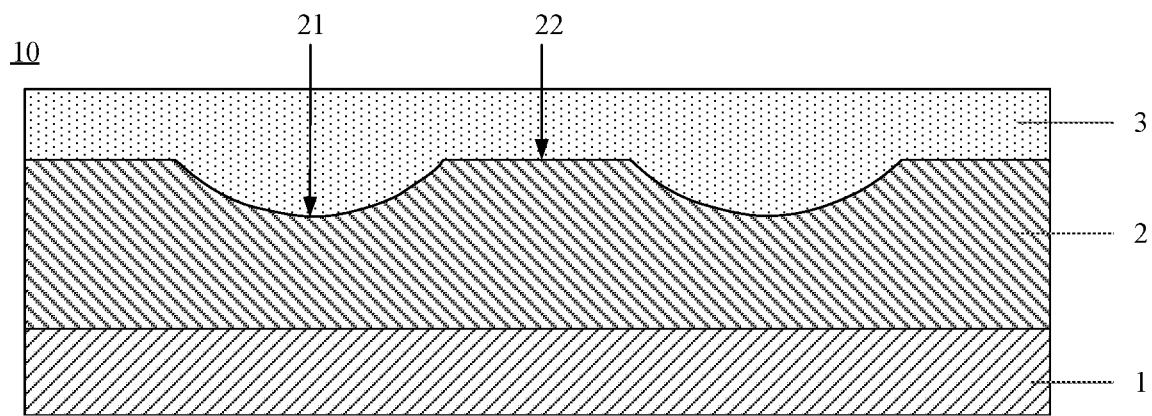
FIG. 1 is a schematic structural diagram of a display substrate according to an embodiment of the present disclosure.

Reference numerals and denotations thereof:

10—display substrate, 1—base substrate, 2—patterned film, 21—depressed portion, 22—non-depressed portion, 3—planarization film, 301—first planarization layer, 302—second planarization layer, 4—first electrode layer, 5—light-emitting layer, 6—second electrode layer, 7—pixel define layer, 8—lyophobic layer, 20—drive circuit, 201—gate drive circuit, 202—source drive circuit, 01—display panel, 02—power supply.

DETAILED DESCRIPTION

Exemplary embodiments of the present disclosure are described below in further detail with reference to the accompanying drawings. Although the accompanying drawings show exemplary embodiments of the present disclosure, it should be understood that the present disclosure may be implemented in various forms and shall not be limited by the embodiments described herein. On the contrary, these embodiments are provided to help more thoroughly understand the present disclosure and entirely convey the scope of the present disclosure to those skilled in the art.

It should be noted that, technical or scientific terms used in the present disclosure should have the same meanings as commonly understood by those skilled in the art of the present disclosure, unless otherwise specified.

However, no matter for an LCD device or an OLED display device, in the case that a formed planarization layer is not flat enough, a sub-pixel film formed on the side of the planarization layer distal from a base substrate is prone to be uneven, thereby seriously affecting the performance of the display device.

For example, because a plurality of thin film transistors that are disposed at intervals are formed on the surface of the base substrate, the surface of the base substrate is uneven. For example, an area where the thin film transistors are disposed may be slightly higher than other positions. Further, the thicknesses of planarization layers formed on the thin film transistors are different from the thicknesses of planarization layers formed on spacings between the plurality of thin film transistors. In addition, because planarization layers of different thicknesses have different shrinkage ratios in a drying process (for example, a relatively thick part of a planarization layer has a relatively high shrinkage ratio), the formed planarization layers are uneven, thereby affecting the flatness of the sub-pixel film formed on the side, distal from the base substrate, of the planarization layer. As a result, the performance of the display device is relatively poor.

FIG. 1 is a schematic structural diagram of a display substrate according to an embodiment of the present disclosure. Referring to FIG. 1, the display substrate 10 may include a base substrate 1, a patterned film 2, and a planarization film 3. The patterned film 2 is disposed on the side of the base substrate 1; and the planarization film 3 is disposed on the side, distal from the base substrate 1, of the patterned film 2.

In the embodiments of the present disclosure, the patterned film 2 may be any film on the side of the base substrate 1, and may be one film or a plurality of films. For example, the patterned film 2 may include a plurality of films forming a thin film transistor.

Referring to FIG. 1, the surface, distal from the base substrate 1, of the patterned film 2 has a depressed portion 21 and a non-depressed portion 22, that is, the surface, distal from the base substrate 1, of the patterned film 2 is uneven. For example, a position where a thin film transistor is disposed is relatively higher than a position between every two adjacent thin film transistors, such that the surface, distal from the base substrate 1, of the patterned film 2 is provided with the depressed portion 21 and the non-depressed portion 22.

The depressed portion 21 may be a recessed portion of the surface, distal from the base substrate 1, of the patterned film 2. The non-depressed portion 22 may be a portion thicker than the depressed portion 21 (that is, a thickness of the depressed portion 21 is less than a thickness of the non-depressed portion 22). Both the thickness of the depressed portion 21 and the thickness of the non-depressed portion 22 are defined in a thickness direction of the base substrate 1. The thickness direction of the base substrate 1 is perpendicular to the bearing surface of the base substrate 1.

In the embodiments of the present disclosure, the surface, distal from the base substrate 1, of the patterned film 2 is uneven. The flatness of the surface of the planarization film 3 is relatively high when the planarization film 3 is in a wet condition (liquid state). However, the portion of the planarization film 3 in an area where the depressed portion 21 is disposed is relatively thick, and the portion of the planarization film 3 in an area where the non-depressed portion 22 is disposed is relatively thin. Because the planarization film 3 has different thicknesses in different areas, the planarization film 3 has different shrinkage ratios in a drying process.

In some embodiments, a shrinkage ratio is positively correlated with a thickness. In other words, a larger thickness corresponds to a higher shrinkage ratio, and a smaller thickness corresponds to a lower shrinkage ratio. In this case, because a thickness of the portion of the planarization film 3 in the area where the depressed portion 21 is disposed is greater than a thickness of the portion of the planarization film 3 in the area where the non-depressed portion 22 is disposed, after the planarization film 3 is dried, the surface of the portion of the planarization film 3 in the area where the depressed portion 21 is disposed is recessed, which makes the surface of the planarization film 3 uneven.

Figure 2:
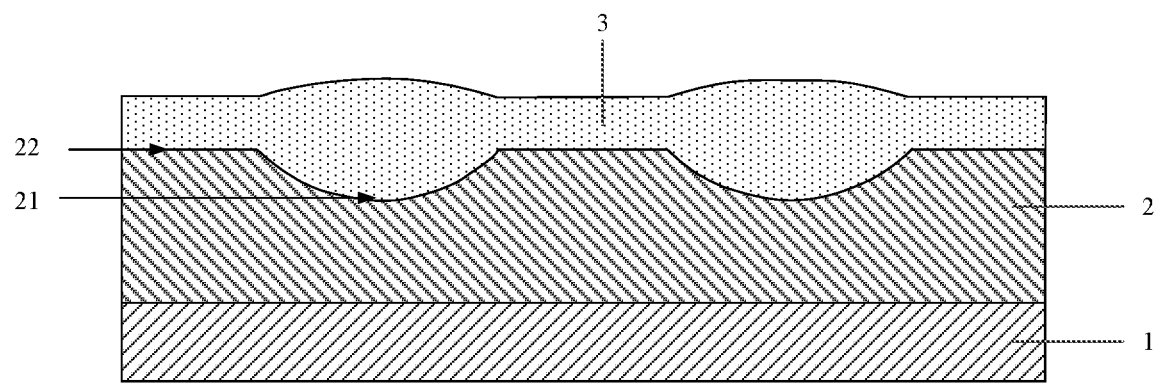
FIG. 2 is a schematic diagram of a planarization film in a wet condition in a display substrate according to an embodiment of the present disclosure.

In the embodiments of the present disclosure, lyophilicity of the depressed portion 21 is higher than lyophilicity of the non-depressed portion 22, and the depressed portion 21 having the higher lyophilicity absorbs the material of the planarization film 3 in the liquid state. Therefore, the depressed portion 21 is preferentially filled with the planarization film 3 in the liquid state. Referring to FIG. 2, in the wet condition, the surface of the portion of the planarization film 3 in the area where the depressed portion 21 is disposed is in a protruding state. In this way, shrinkage can be reserved for the portion of the planarization film 3 in the area where the depressed portion 21 is disposed, thereby optimizing the flatness of the surface of the dried planarization film 3, improving the flatness of the sub-pixel film subsequently formed on the side, distal from the base substrate, of the planarization film, and ensuring the performance of the display device.

The lyophilicity of the depressed portion 21 may be lyophilicity of a film in the area where the depressed portion 21 is disposed. The lyophilicity of the non-depressed portion 22 may be lyophilicity of a film in the area where the non-depressed portion 22 is disposed.

For example, the lyophilicity of the depressed portion 21 may be lyophilicity of a surface of the patterned film 2 in the area where the depressed portion 21 is disposed; and the lyophilicity of the non-depressed portion 22 may be lyophilicity of a surface of the patterned film 2 in the area where the non-depressed portion 22 is disposed.

In addition, flatness refers to that the surface of an object is not absolutely flat. The flatness can be represented by evaluating deviation values of longitudinal depression and projection degrees of the surface. In a longitudinal direction, the smaller the deviation value of offset of the surface of the object from a same horizontal plane, the flatter the surface of the object.

In summary, the embodiments of the present disclosure provide a display substrate. In the display substrate, the lyophilicity of the depressed portion of the patterned film is higher than the lyophilicity of the non-depressed portion of the patterned film, and the depressed portion having the higher lyophilicity absorbs a material of the planarization film in the liquid state. Therefore, the depressed portion can be preferentially filled with the planarization film, and the planarization film turns into a protruding state. In this way, shrinkage is reserved for the portion of the planarization film in the area where the depressed portion is disposed, thereby improving the flatness of the surface of a dried planarization film, further ensuring the flatness of another film formed on the planarization film, and ensuring the performance of the display device.

In some embodiments, the base substrate 1 may be a glass substrate or a flexible substrate. The material of the base substrate 1 is not specifically limited in the embodiments of the present disclosure.

Figure 3:
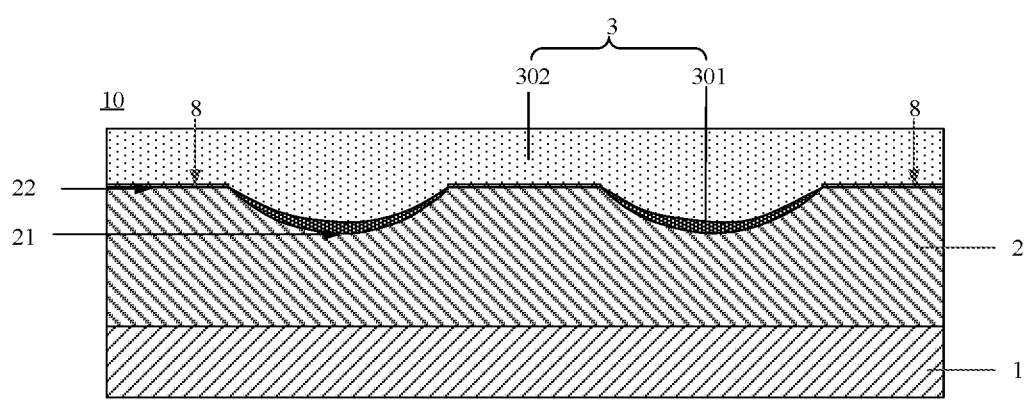
FIG. 3 is a schematic structural diagram of another display substrate according to an embodiment of the present disclosure.

FIG. 3 is a schematic structural diagram of another display substrate according to the embodiments of the present disclosure. Referring to FIG. 3, the planarization film 3 may include a first planarization layer 301 and a second planarization layer 302 that are sequentially laminated in a direction going away from the patterned film 2.

The first planarization layer 301 is disposed in the depressed portion 21. An orthographic projection of the first planarization layer 301 on the base substrate 1 is not overlapped with an orthographic projection of the non-depressed portion 22 on the base substrate. A thickness of the first planarization layer 301 is not greater than a depth of the depressed portion 21. The depth of the depressed portion 21 may be used to represent the distance between the surface, distal from the base substrate 1, of the depressed portion 21 and the surface, distal from the base substrate 1, of the non-depressed portion 22.

An orthographic projection of the second planarization layer 302 on the base substrate 1 is overlapped with the orthographic projection of the non-depressed portion 22 on the base substrate 1, and is overlapped with the orthographic projection of the depressed portion 21 on the base substrate 1. In other words, the second planarization layer 302 may be disposed on the non-depressed portion 22 and the first planarization layer 301 in the depressed portion 21.

Lyophilicity of the first planarization layer 301 is higher than lyophilicity of the second planarization layer 302.

By configuring the first planarization layer 301, in one aspect, a height difference between a film in the area where the depressed portion 21 is disposed and a film in the area where the non-depressed portion 22 is disposed can be reduced, thereby reducing the shrinkage ratio difference between a portion of the second planarization layer 302 in the area where the depressed portion 21 is disposed and a portion of the second planarization layer 302 in the area where the non-depressed portion 22 is disposed. In another aspect, the lyophilicity of the first planarization layer 301 in the depressed portion 21 is relatively high, such that the second planarization layer 302 can gather in the depressed portion 21 and turn into a protruding state, that is, shrinkage can be reserved for the portion of the second planarization layer 302 in the area where the depressed portion 21 is disposed, thereby further optimizing flatness of the surface of a dried second planarization layer 302.

In the embodiments of the present disclosure, after the planarization film 3 is disposed on the side, distal from the base substrate 1, of the patterned film 2, the flatness of the surface, distal from the patterned film 2, of the planarization film 3 can be greater than the flatness of the surface, distal from the base substrate, of the patterned film 2.

In some embodiments, the flatness of the surface, distal from the first planarization layer 301, of the second planarization layer 302 is greater than the flatness of the surface, distal from the base substrate 1, of the patterned film 2; and the flatness of the surface, distal from the first planarization layer 301, of the second planarization layer 302 is greater than the flatness of the surface of the patterned film 2 after the first planarization layer 301 is formed in the depressed portion 21.

In the embodiments of the present disclosure, the display substrate may further include a lyophobic layer 8. The lyophobic layer is disposed between the non-depressed portion 22 and the planarization film 3, such that the lyophilicity of the depressed portion 21 is higher than the lyophilicity of the non-depressed portion 22.

In some embodiments, because the lyophobic layer is formed on the surface of the non-depressed portion 22, the non-depressed portion 22 has a lyophobic feature relative to the depressed portion 21, such that the planarization film 3 gathers in the area where the depressed portion 21 is disposed and forms a protrusion. In this way, the surface of the dried planarization film 3 is relatively flat, thereby optimizing the flatness of the planarization film 3.

Figure 4:
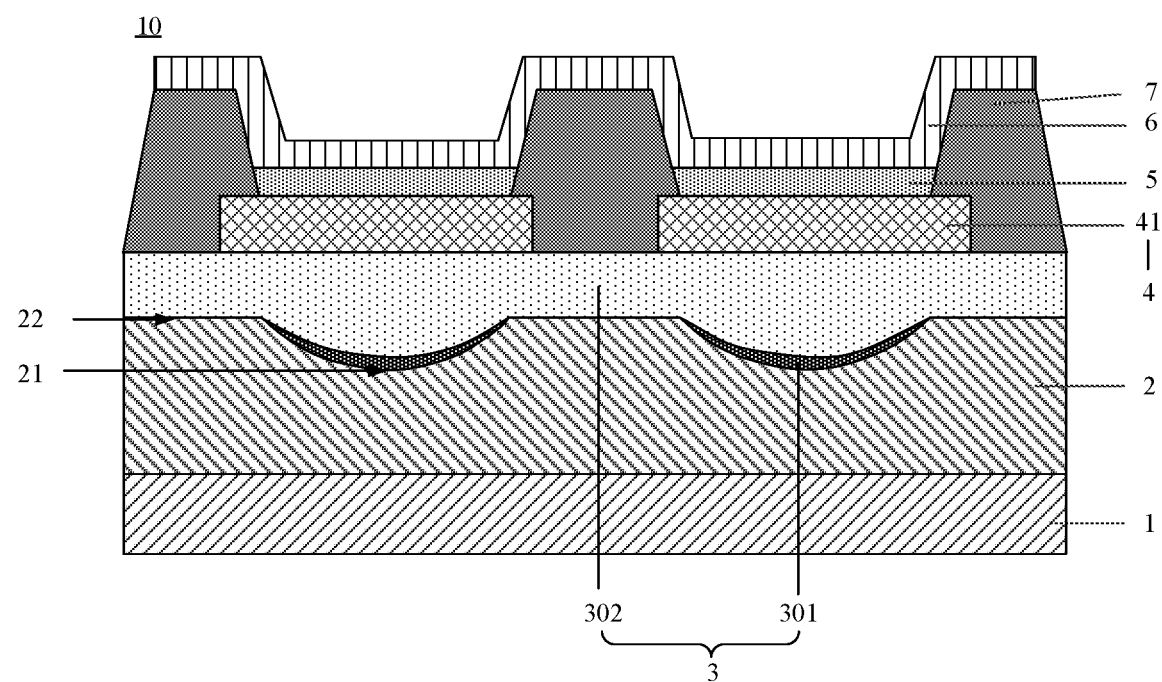
FIG. 4 is a schematic structural diagram of still another display substrate according to an embodiment of the present disclosure.

FIG. 4 is a schematic structural diagram of still another display substrate according to an embodiment of the present disclosure. Referring to FIG. 4, the display substrate may be further provided with a first electrode layer 4, a light-emitting layer 5, and a second electrode layer 6. The light-emitting layer 5 emits light under driving of the first electrode layer 4 and the second electrode layer 6. In some embodiments, the first electrode layer 4 may be an anode layer; the second electrode layer 6 may be a cathode layer; and the first electrode layer 4 may be made of indium tin oxide (ITO).

Referring to FIG. 4, the first electrode layer 4 may include a plurality of spaced electrode patterns 41 (for example, two electrode patterns 41 shown in FIG. 4). Each electrode pattern 41 may be used as an anode of a sub-pixel.

It can be further learned from FIG. 4 that the display substrate may be further provided with a pixel define layer 7. The pixel define layer 7 may be disposed on a side, distal from the base substrate 1, of the first electrode layer 4. The pixel define layer 7 may include a hollowed-out area. The hollowed-out area may expose at least part of the first electrode layer 4. The light-emitting layer 5 is disposed in the hollowed-out area, and is in contact with the first electrode layer 4.

In an exemplary embodiment, the pixel define layer 7 may include a plurality of hollowed-out areas. Each hollowed-out area exposes at least part of one electrode pattern 41.

In summary, the embodiments of the present disclosure provide a display substrate. In the display substrate, the lyophilicity of the depressed portion of the patterned film is higher than the lyophilicity of the non-depressed portion of the patterned film, and the depressed portion having the higher lyophilicity absorbs the material of the planarization film in the liquid state. Therefore, the depressed portion can be preferentially filled with the planarization film, and the planarization film turns into a protruding state. In this way, shrinkage is reserved for the portion of the planarization film in the area where the depressed portion is disposed, thereby improving the flatness of the surface of a dried planarization film, further ensuring the flatness of another film formed on the planarization film, and ensuring the performance of the display device.

Figure 5:
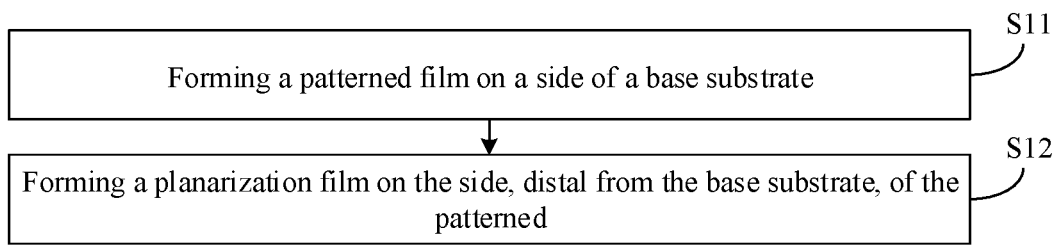
FIG. 5 is a flowchart of a method for preparing a display substrate according to an embodiment of the present disclosure.

FIG. 5 is a flowchart of a method for preparing a display substrate according to an embodiment of the present disclosure. Referring to FIG. 5, the method may include the following steps.

In S11, a patterned film is formed on a side of a base substrate.

In this embodiment of the present application, the patterned film 2 may be any film formed on the base substrate 1, and may be one film or a plurality of films. For example, the patterned film 2 may include a plurality of films forming a thin film transistor.

Figure 6:
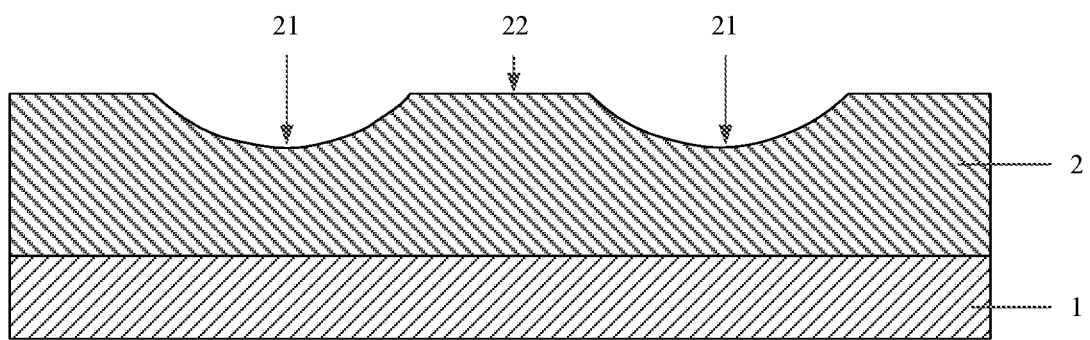
FIG. 6 is a schematic diagram of forming a patterned film according to an embodiment of the present disclosure.

Referring to FIG. 6, the surface, distal from the base substrate 1, of the patterned film 2 is uneven. For example, a position where the thin film transistor is disposed is slightly higher than other positions. In this way, the surface, distal from the base substrate 1, of the patterned film 2 has a depressed portion 21 and a non-depressed portion 22.

The depressed portion 21 may be a recessed portion of the surface, distal from the base substrate 1, of the patterned film 2. The non-depressed portion 22 may be a portion thicker than the depressed portion 21 (that is, the thickness of the depressed portion 21 is less than the thickness of the non-depressed portion 22). Both the thickness of the depressed portion 21 and the thickness of the non-depressed portion 22 are defined in the thickness direction of the base substrate 1. The thickness direction of the base substrate 1 is perpendicular to a bearing surface of the base substrate 1.

In addition, the base substrate 1 may be a glass substrate or a flexible substrate. The material of the base substrate 1 is not specifically limited in the embodiments of the present disclosure.

In S12, a planarization film is formed on the side, distal from the base substrate, of the patterned film.

In the embodiments of the present disclosure, the surface, distal from the base substrate, of the patterned film 2 is uneven. In the case that the planarization film 3 is directly formed on the patterned film 2, the flatness of the surface of the planarization film 3 is relatively high in the wet condition. However, in the wet condition, the portion of the planarization film 3 in an area where the depressed portion 21 is disposed is relatively thick, and the portion of the planarization film 3 in an area where the non-depressed portion 22 is disposed is relatively thin. Because the planarization film 3 has different thicknesses in different areas, the planarization film 3 has different shrinkage ratios in a drying process.

In some embodiments, a shrinkage ratio is positively correlated with a thickness. In other words, a larger thickness corresponds to a higher shrinkage ratio, and a smaller thickness corresponds to a lower shrinkage ratio. In this case, because the thickness of the portion of the planarization film 3 in the area where the depressed portion 21 is disposed is greater than the thickness of the portion of the planarization film 3 in the area where the non-depressed portion 22 is disposed, the shrinkage ratio of the portion of the planarization film 3 in the area where the depressed portion 21 is disposed is relatively high, and the shrinkage ratio of the portion of the planarization film 3 in the area where the non-depressed portion 22 is disposed is relatively low. Further, after the planarization film 3 is dried, the surface of the portion of the planarization film 3 in the area where the depressed portion 21 is disposed is recessed, which makes the surface of the planarization film 3 uneven.

In the embodiments of the present disclosure, because the lyophilicity of the depressed portion 21 is higher than the lyophilicity of the non-depressed portion 22, and the depressed portion 21 having the higher lyophilicity absorbs the material of the planarization film 3 in the liquid state, the depressed portion 21 is preferentially filled with the planarization film 3. Referring to FIG. 2, in the wet condition, the surface of the portion of the planarization film 3 in the area where the depressed portion 21 is disposed is protruding. In this way, shrinkage can be reserved for the portion of the planarization film 3 in the area where the depressed portion 21 is disposed, thereby optimizing the flatness of the surface of the dried planarization film 3.

Referring to FIG. 3, the flatness of the planarization film 3 in the embodiments of the present disclosure is higher than the flatness of a planarization film formed in the case that the lyophilicity of the depressed portion 21 and the lyophilicity of the non-depressed portion 22 are consistent. Then, a first electrode layer 4, a pixel define layer 7, a light-emitting layer 5, and a second electrode layer 6 are formed on the surface of the planarization film 3 with relatively high flatness. The uniformity of film formation of the first electrode layer 4, the pixel define layer 7, the light-emitting layer 5, and the second electrode layer 6 can be improved, thereby improving the light-emitting quality of the display device. The thickness of the planarization film 3 can be determined based on the depth of the depressed portion 21 and the shrinkage ratio of the material of the planarization film 3.

Flatness refers to that the surface of an object is not absolutely flat. The flatness can be represented by evaluating deviation values of longitudinal depression and projection degrees of the surface. In a longitudinal direction, the smaller the deviation value of offset of the surface of the object from a same horizontal plane, the flatter the surface of the object.

According to the method for preparing a display substrate in this embodiment of the present disclosure, after the patterned film 2 is formed on the base substrate 1, the lyophilicity of the depressed portion 21 on the surface, distal from the base substrate 1, of the patterned film 2 is set to be higher than the lyophilicity of the non-depressed portion 22, such that the depressed portion 21 having the higher lyophilicity absorbs the material of the planarization film 3, and the depressed portion 21 is preferentially filled with the planarization film 3 in the liquid state. In this way, in the wet condition, the surface of the portion of the planarization film 3 in the area where the depressed portion 21 is disposed is protruding, that is, shrinkage can be reserved for the planarization film 3 corresponding to the depressed portion 21, thereby optimizing the flatness of the surface of the dried planarization film 3. In other words, the flatness of the planarization film 3 is improved, such that the surface of the planarization film 3 is flatter, and the technical problem in the prior art that a planarization film 3 is uneven in a preparing process is effectively resolved.

In summary, the embodiments of the present disclosure provide a method for preparing a display substrate. In the display substrate prepared by the method, the lyophilicity of the depressed portion of the patterned film is higher than the lyophilicity of the non-depressed portion of the patterned film, and the depressed portion having the higher lyophilicity absorbs the material of the planarization film in the liquid state. Therefore, the depressed portion can be preferentially filled with the planarization film, and the planarization film turns into a protruding state. In this way, shrinkage is reserved for the portion of the planarization film in the area where the depressed portion is disposed, thereby improving the flatness of the surface of a dried planarization film, further ensuring the flatness of another film formed on the planarization film, and ensuring the performance of the display device.

Figure 7:
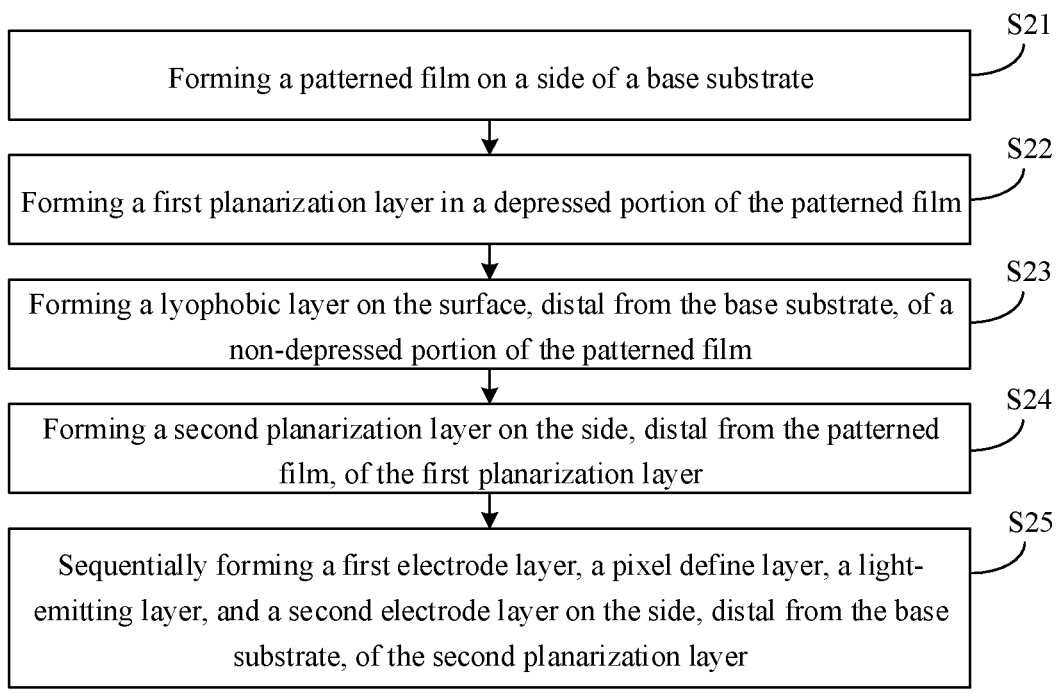
FIG. 7 is a flowchart of another method for preparing a display substrate according to an embodiment of the present disclosure.

FIG. 7 is a flowchart of another method for preparing a display substrate according to an embodiment of the present disclosure. Referring to FIG. 7, the method may include the following steps.

In S21, a patterned film is formed on a side of a base substrate.

In the embodiments of the present application, the patterned film 2 may be any film formed on the base substrate 1, and may be one film or a plurality of films. For example, the patterned film 2 may include a plurality of films forming a thin film transistor.

Referring to FIG. 6, the surface, distal from the base substrate 1, of the patterned film 2 is uneven. For example, a position where the thin film transistor is disposed is slightly higher than other positions, such that the surface, distal from the base substrate 1, of the patterned film 2 is provided with a depressed portion 21 and a non-depressed portion 22.

The depressed portion 21 may be a recessed portion of the surface, distal from the base substrate 1, of the patterned film 2. The non-depressed portion 22 may be a portion thicker than the depressed portion 21 (that is, a thickness of the depressed portion 21 is less than a thickness of the non-depressed portion 22). Both the thickness of the depressed portion 21 and the thickness of the non-depressed portion 22 are defined in a thickness direction of the base substrate 1. The thickness direction of the base substrate 1 is perpendicular to a bearing surface of the base substrate 1.

In addition, the base substrate 1 may be a glass substrate or a flexible substrate. The material of the base substrate 1 is not specifically limited in the embodiments of the present disclosure.

In S22, a first planarization layer is formed in a depressed portion of the patterned film.

Figure 8:
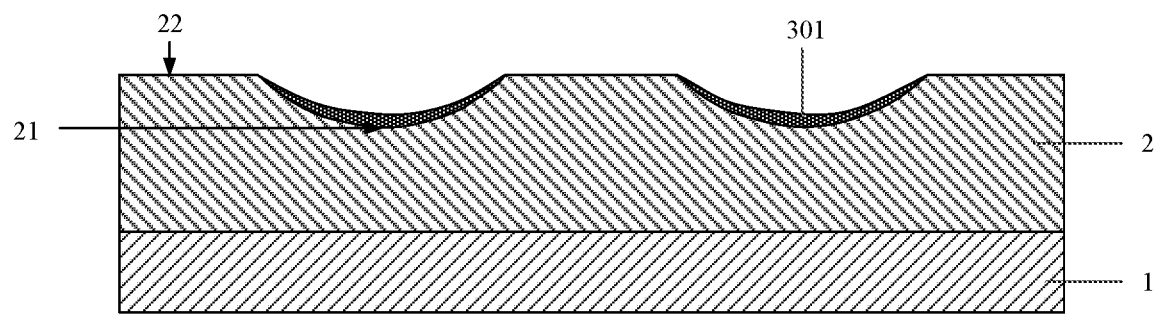
FIG. 8 is a schematic diagram of forming a first planarization layer according to an embodiment of the present disclosure.

In the embodiments of the present disclosure, referring to FIG. 8, the orthographic projection of the first planarization layer 301 on the base substrate 1 is not overlapped with the orthographic projection of the non-depressed portion 22 on the base substrate 1; and the thickness of the first planarization layer 301 is not greater than the depth of the depressed portion 21. The depth of the depressed portion 21 may be used to represent the distance between the surface, distal from the base substrate 1, of the depressed portion 21 and the surface, distal from the base substrate 1, of the non-depressed portion 22.

In some embodiments, a first planarization layer 301 is formed in the depressed portion 21 on the surface, distal from the base substrate 1, of the patterned film 2. The depressed portion 21 is not completely filled or is just completely filled by the first planarization layer 301, thereby ensuring that the thickness of the first planarization layer 301 is not greater than the depth of the depressed portion 21. For example, the first planarization layer 301 may be a thin film formed at the bottom of the depressed portion 21.

In some embodiments, the display substrate includes a display area and a non-display area. The first planarization layer 301 being formed in the depressed portion 21 may indicate that: the first planarization layer 301 is formed in the depressed portion 21 that is of the patterned film 2 and only in the display area of the display substrate; or the first planarization layers 301 are formed in the depressed portions 21 that are of the patterned film 2 and in both the display area and the non-display area of the display substrate. In addition, the non-display area of the display substrate is not used for displaying and is not provided with any light-emitting component. Therefore, in the embodiments, the first planarization layer 301 is preferentially formed in the depressed portion 21 that is of the patterned film 2 and in the display area of the display substrate.

Figure 9:
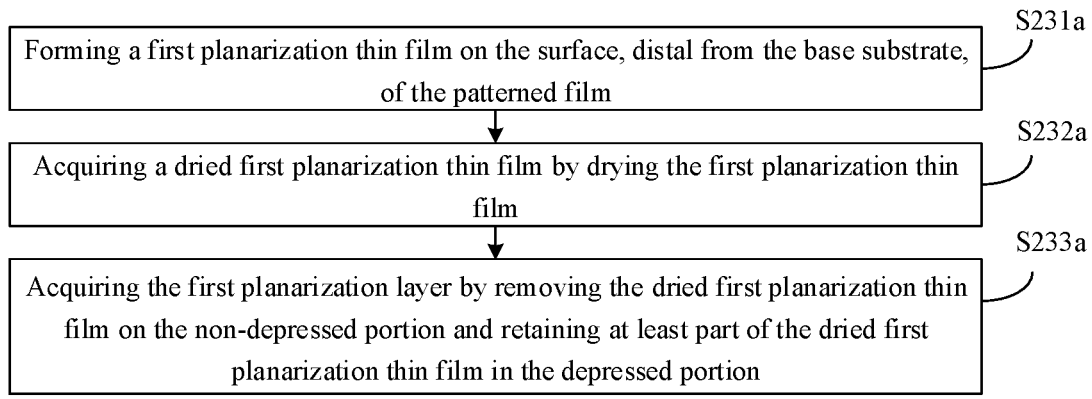
FIG. 9 is a flowchart of a method for forming a first planarization layer according to an embodiment of the present disclosure.

In an exemplary embodiment, referring to FIG. 9, forming the first planarization layer 301 includes the following steps.

In S231a, a first planarization thin film is formed on the surface, distal from the base substrate, of the patterned film.

In the embodiments of the present disclosure, the first planarization thin film is integrally formed on the surface, distal from the base substrate, of the patterned film 2. The first planarization thin film may include a preparation material of the first planarization layer 301 and a solvent. The integral formation of the first planarization thin film indicate that the first planarization thin film covers the patterned film 2.

In some embodiments, the first planarization thin film may be formed on the surface, distal from the base substrate 1, of the patterned film 2 by slit coating, spin coating, or spray coating.

In S232a, a dried first planarization thin film is acquired by drying the first planarization thin film.

In some embodiments, a drying process may be performed on the first planarization thin film after a surface of the first planarization thin film is leveled out. In the drying process, the solvent in the first planarization thin film evaporates, and the dried first planarization thin film is acquired (only the preparation material remains) to form the first planarization layer 301.

To improve the film forming quality of the first planarization layer 301, in the drying process of the first planarization thin film, vacuum cooling may also be performed on the first planarization thin film. In an exemplary embodiment, vacuum cooling and vacuum drying may be performed on the first planarization thin film by a vacuum cool dry (VCD).

In S233a, the first planarization layer is acquired by removing the dried first planarization thin film on the non-depressed portion and retaining at least part of the dried first planarization thin film in the depressed portion.

In the embodiments of the present disclosure, because the first planarization layer 301 needs to be disposed in only the depressed portion 21, but the dried first planarization thin film is disposed not only in the depressed portion 21, but also on the surface of the non-depressed portion 22, a portion of the dried first planarization thin film in an area where the non-depressed portion 22 is disposed needs to be removed. For example, the portion may be removed by dry etching or development.

In the case that dry etching is used for removing the portion of the dried first planarization thin film in the area where the non-depressed portion 22 is disposed, the portion of the dried first planarization thin film in the depressed portion 21 can also be removed at the same time. During formation, the first planarization thin film is a liquid capable of flowing, such that the depressed portion 21 is preferentially filled. After the first planarization thin film is formed, because a thickness of the portion of the first planarization thin film in an area where the depressed portion 21 is disposed is greater than a thickness of the portion of the first planarization thin film in the area where the non-depressed portion 22 is disposed, after removing of the dried first planarization thin film, at least part of the dried first planarization thin film remains in the depressed portion 21. The at least part of the dried first planarization thin film that remains is the first planarization layer 301.

Figure 10:
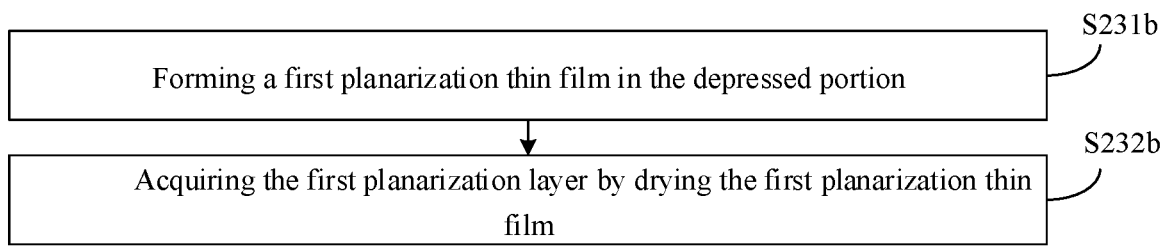
FIG. 10 is a flowchart of another method for forming a first planarization layer according to an embodiment of the present disclosure.

In some embodiments, referring to FIG. 10, forming the first planarization layer 301 includes the following steps.

In S231b, a first planarization thin film is formed in the depressed portion.

In the embodiments of the present disclosure, the first planarization thin film may be formed in the depressed portion 21, that is, an orthographic projection of the first planarization thin film on the base substrate 1 is not overlapped with the orthographic projection of the non-depressed portion 22 on the base substrate 1.

In some embodiments, the first planarization thin film may be formed in the depressed portion 21 by a printing process (also referred to as a printing method). Because the precision of the printing method is relatively high, printing may be directly performed in the depressed portion 21 to form the first planarization thin film. In this way, the first planarization thin film can be prevented from being formed in the non-depressed portion 22 outside the depressed portion 21, thereby eliminating an operation of removing the first planarization thin film formed on the surface of the non-depressed portion 22.

In S232b, the first planarization layer is acquired by drying the first planarization thin film.

In the embodiments of the present disclosure, upon the first planarization thin film being formed, drying may be performed on the first planarization thin film according to the foregoing S232a, thereby forming the first planarization layer 301.

In addition to the foregoing method, the first planarization layer 301 may also be directly formed via a chemical vapor deposition (CVD) process. A method according to which the first planarization layer 301 is formed is not limited in the embodiments of the present disclosure.

In S23, a lyophobic layer is formed on the surface, distal from the base substrate, of a non-depressed portion of the patterned film.

In the embodiments of the present disclosure, the lyophobic layer is formed on the surface of the non-depressed portion 22 after the first planarization layer 301 is formed, which can further control and optimize lyophilic and lyophobic features of the depressed portion 21 and the non-depressed portion 22, and effectively optimize the flatness of the planarization film 3.

In S24, a second planarization layer is formed on the side, distal from the patterned film, of the first planarization layer.

Figure 11:
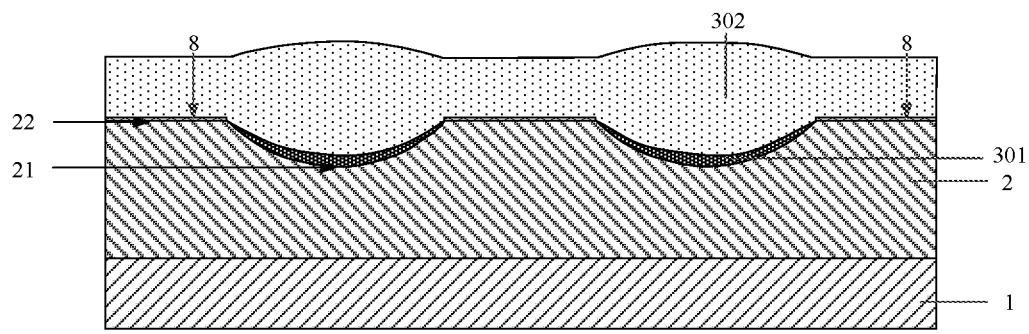
FIG. 11 is a schematic diagram of a wet film-state second planarization layer according to an embodiment of the present disclosure.

In the embodiments of the present disclosure, upon a dried first planarization layer 301 is formed, the second planarization layer 302 may be formed on a first surface of the formed first planarization layer 301. In addition, the lyophilicity of the first planarization layer 301 is set to be higher than the lyophilicity of the second planarization layer 302, such that the lyophilicity of the depressed portion 21 is higher than the lyophilicity of the non-depressed portion 22. Therefore, by configuring the first planarization layer 301, in one aspect, the height difference between a film in the area where the depressed portion 21 is disposed and a film in the area where the non-depressed portion 22 is disposed can be reduced, thereby reducing the shrinkage ratio difference between the portion of the second planarization layer 302 in the area where the depressed portion 21 is disposed and the portion of the second planarization layer 302 in the area where the non-depressed portion 22 is disposed. In another aspect, the lyophilicity of the first planarization layer 301 in the depressed portion 21 is relatively high, such that the material of the second planarization layer 302 can be absorbed, and the depressed portion 21 can be preferentially filled with the second planarization layer 302. Further, referring to FIG. 11, in the wet condition, the surface of the portion of the second planarization layer 302 in the area where the depressed portion 21 is disposed is protruding, such that shrinkage can be reserved for the portion of the second planarization layer 302 in the area where the depressed portion 21 is disposed.

Therefore, referring to FIG. 3, the flatness of the surface of the second planarization layer 302 is relatively high after drying, which can further optimize the flatness of the surface of a dried second planarization layer 302. With reference to FIGS. 3 and 8, the flatness of the second planarization layer 302 is higher than the flatness of the surface, distal from the base substrate 1, of the patterned film 2 after the first planarization layer 301 is formed.

In some embodiments, the materials of the first planarization layer 301 and the second planarization layer 302 are not specifically limited herein. For example, the material may be resin. In addition, a material capable of enhancing the lyophilicity of the first planarization layer may be added to the material of the first planarization layer.

Figure 12:
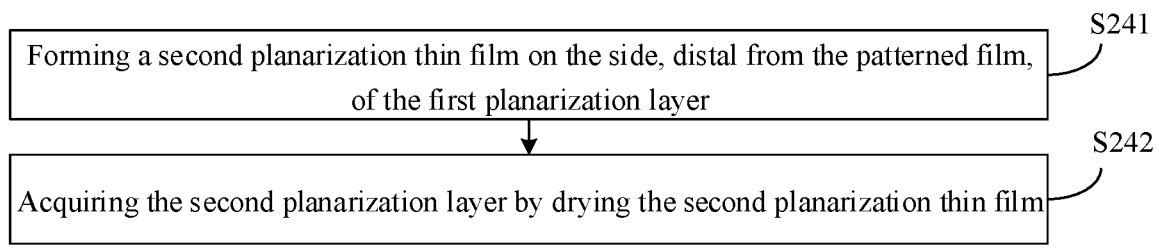
FIG. 12 is a flowchart of a method for forming a second planarization layer according to an embodiment of the present disclosure.

In an exemplary embodiment, referring to FIG. 12, forming the second planarization layer 302 may include the following steps.

In S241, a second planarization thin film is formed on the side, distal from the patterned film, of the first planarization layer.

In the embodiments of the present disclosure, the second planarization thin film is integrally formed on the non-depressed portion 22 and the first planarization layer 301 in the depressed portion 21 by slit coating, spin coating, or spray coating. The second planarization thin film may include a preparation material of the second planarization layer 302 and a solvent.

In S242, the second planarization layer is acquired by drying the second planarization thin film.

In some embodiments, a drying process may be performed on the second planarization thin film after a surface of the second planarization thin film is leveled out. In the drying process, the solvent in the second planarization thin film evaporates, and a dried second planarization thin film is acquired (only the preparation material remains) to form the second planarization layer 302.

To improve the film forming quality of the second planarization layer 302, in the drying process of the second planarization thin film, vacuum cooling may also be performed on the second planarization thin film. In an exemplary embodiment, vacuum cooling and vacuum drying may be performed on the second planarization thin film by a vacuum cool dry.

In S25, a first electrode layer, a pixel define layer, a light-emitting layer, and a second electrode layer are sequentially formed on the side, distal from the base substrate, of the second planarization layer.

In the embodiments of the present disclosure, after the second planarization layer 302 is formed, the first electrode layer 4 may be first formed on the side, distal from the base substrate 1, of the second planarization layer 302. The first electrode layer 4 includes a plurality of spaced electrode patterns 41. Each electrode pattern 41 may be used as an anode of a sub-pixel.

In some embodiments, forming the first electrode layer 4 may include: forming the first electrode thin film on the side, distal from the base substrate 1, of the second planarization layer 302; and acquiring the first electrode layer by patterning the first electrode thin film. The patterning may include photoresist patterning, exposing, developing, etching, and photoresist removing.

After the first electrode layer 4 is formed, a pixel define layer 7 may be formed on a side, distal from the base substrate 1, of the first electrode layer 4. The pixel define layer 7 may include a hollowed-out area. The hollowed-out area may expose at least part of the first electrode layer 4. For example, the pixel define layer 7 may include a plurality of hollowed-out areas. Each hollowed-out area exposes at least part of one electrode pattern 41.

In some embodiments, forming the pixel define layer 7 may include: forming a pixel defining thin film on the side, distal from the base substrate 1, of the first electrode layer 4; and acquiring the pixel define layer by patterning the pixel defining thin film.

Upon the pixel define layer 7 is formed, a light-emitting layer 5 may be formed in the hollowed-out area of the pixel define layer 7, such that the light-emitting layer 5 is disposed in the hollowed-out area, and is in contact with the electrode pattern 41 exposed out of the hollowed-out area.

Upon the light-emitting layer 5 is formed, a second electrode layer 6 may be formed on the side, distal from the base substrate 1, of the light-emitting layer 5. An orthographic projection of the second electrode layer 6 on the base substrate 1 is overlapped with an orthographic projection of the light-emitting layer 5 on the base substrate 1, and is overlapped with an orthographic projection of the pixel define layer 7 on the base substrate 1. In this case, cathodes of a plurality of sub-pixels in the display substrate can be shared.

Because the flatness of the surface, distal from the base substrate 1, of the second planarization layer 302 is relatively high, the film forming uniformity of the first electrode layer 4, the pixel define layer 7, the light-emitting layer 5, and the second electrode layer 6 that are formed on the surface of the second planarization layer 302 is relatively high, which can improve the light-emitting quality of the display device.

It should be noted that, the order of the steps of the method for preparing a display substrate according to the embodiments of the present disclosure can be appropriately adjusted. The steps may also be removed or added as required. For example, S23 may be deleted as required. Any variation method readily figured out by a person skilled in the art within the technical scope disclosed in the present disclosure shall fall within the protection scope of the present disclosure. Therefore, details are not described herein again.

In summary, the embodiments of the present disclosure provide a method for preparing a display substrate. In the display substrate prepared according to the method, the lyophilicity of the depressed portion of the patterned film is higher than the lyophilicity of the non-depressed portion of the patterned film, and the depressed portion having the higher lyophilicity absorbs the material of the planarization film in the liquid state. Therefore, the depressed portion can be preferentially filled with the planarization film, and the planarization film turns into a protruding state. In this way, shrinkage is reserved for the portion of the planarization film in the area where the depressed portion is disposed, thereby improving the flatness of the surface of a dried planarization film, further ensuring the flatness of another film formed on the planarization film, and ensuring the performance of the display device.

Figure 13:
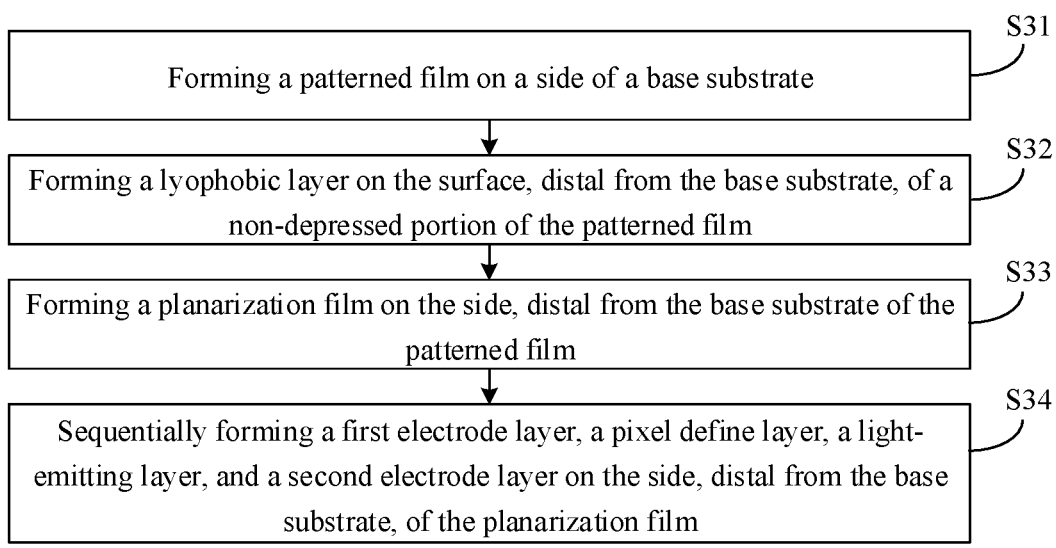
FIG. 13 is a flowchart of a method for forming a second planarization layer according to an embodiment of the present disclosure.

FIG. 13 is a flowchart of still another method for preparing a display substrate according to an embodiment of the present disclosure. Referring to FIG. 13, the method may include the following steps.

In S31, a patterned film is formed on a side of a base substrate.

For details about S31 in the embodiments of the present disclosure, reference may be made to the specific description of S21, which are not described herein any further.

In S32, a lyophobic layer is formed on the surface, distal from the base substrate, of a non-depressed portion of the patterned film.

In the embodiments of the present disclosure, the lyophobic layer may be formed on the surface of the non-depressed portion 22, to ensure that the lyophilicity of the depressed portion 21 is higher than the lyophilicity of the non-depressed portion 22.

In S33, a planarization film is formed on the side, distal from the base substrate, of the patterned film.

Because the lyophobic layer is formed on the surface of the non-depressed portion 22, in the case that the planarization film 3 is formed, the non-depressed portion 22 has a lyophobic feature relative to the depressed portion 21. In this way, the planarization film 3 can gather in the depressed portion 21 and form a protrusion, thereby ensuring that the surface of the planarization film 3 is relatively flat after drying, and further optimizing the flatness of the planarization film 3. In other words, after the lyophobic layer is formed on the surface of the non-depressed portion 22, the planarization film 3 may be directly formed on the patterned film 2 to optimize the flatness of the planarization film 3.

In S34, a first electrode layer, a pixel define layer, a light-emitting layer, and a second electrode layer are sequentially formed on the side, distal from the base substrate, of the planarization film.

For details about S34 in the embodiments of the present disclosure, reference may be made to the specific description of S25, which are not described herein any further.

In summary, the embodiments of the present disclosure provide a method for preparing a display substrate. In the display substrate prepared according to the method, the lyophilicity of the depressed portion of the patterned film is higher than the lyophilicity of the non-depressed portion of the patterned film, and the depressed portion having the higher lyophilicity absorbs the material of the planarization film in the liquid state. Therefore, the depressed portion can be preferentially filled with the planarization film, and the planarization film turns into a protruding state. In this way, shrinkage is reserved for the portion of the planarization film in the area where the depressed portion is disposed, thereby improving the flatness of the surface of a dried planarization film, further ensuring the flatness of another film formed on the planarization film, and ensuring the performance of the display device.

Figure 14:
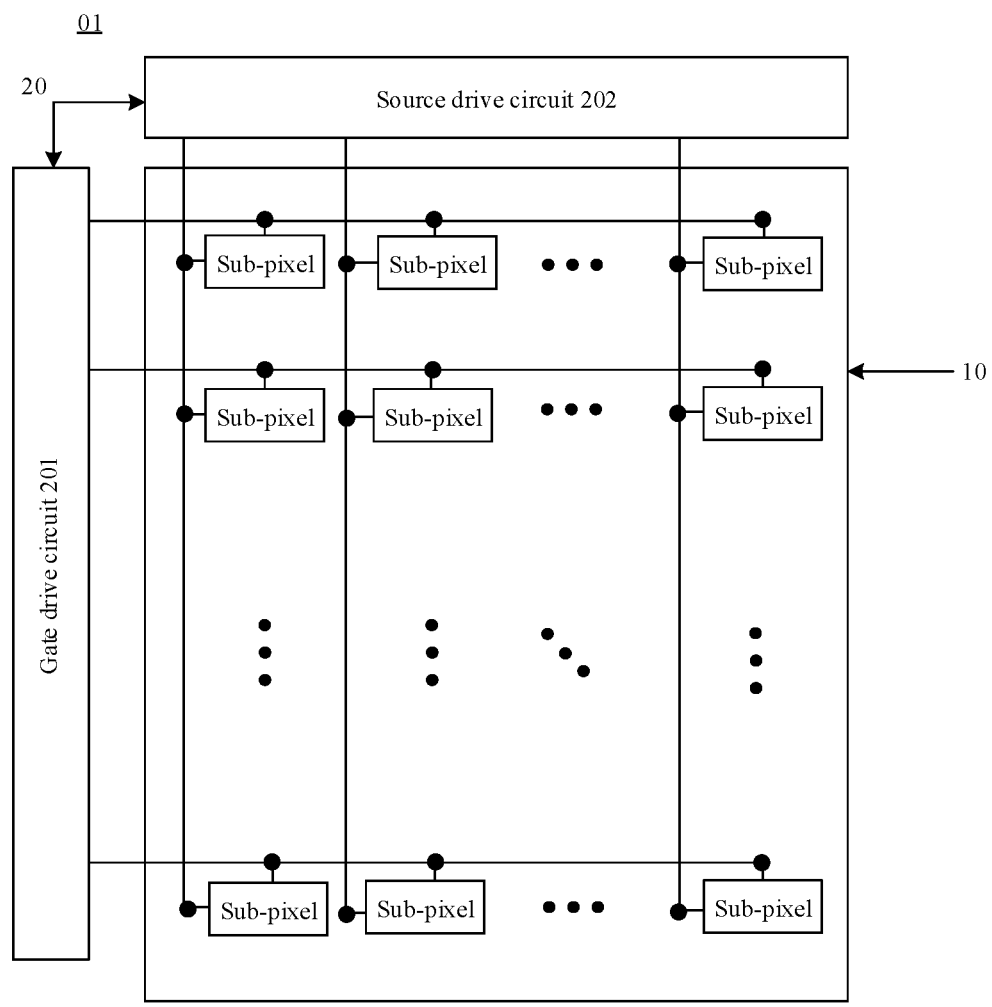
FIG. 14 is a schematic structural diagram of a display panel according to an embodiment of the present disclosure.

FIG. 14 is a schematic structural diagram of a display panel according to an embodiment of the present disclosure. Referring to FIG. 14, the display panel 01 may include a drive circuit 20 and a display substrate. The drive circuit 20 may be connected to the display substrate. The drive circuit 20 is configured to provide a drive signal for a sub-pixel in the display substrate. The display substrate may be the display substrate 10 according to the above embodiments.

Referring to FIG. 14, the drive circuit 20 may include a gate drive circuit 201 and a source drive circuit 202. The gate drive circuit 201 may be connected to each row of sub-pixels in the display substrate 10 via a gate line, and is configured to provide a gate drive signal for each row of sub-pixels. The source drive circuit 202 may be connected to each column of sub-pixels in the display substrate 10 via a data line, and is configured to provide a data signal for each column of sub-pixels.

The display panel in the embodiments of the present disclosure include the foregoing display substrate. The flatness of the planarization film 3 of the foregoing display substrate is optimized by using the lyophilic and lyophobic features and taking the shrinkage ratios of the planarization film 3 having different thicknesses into consideration. In this way, the uniformity of another film formed on the planarization film 3 is ensured, thereby ensuring that light emitted by the display panel is uniform.

Figure 15:
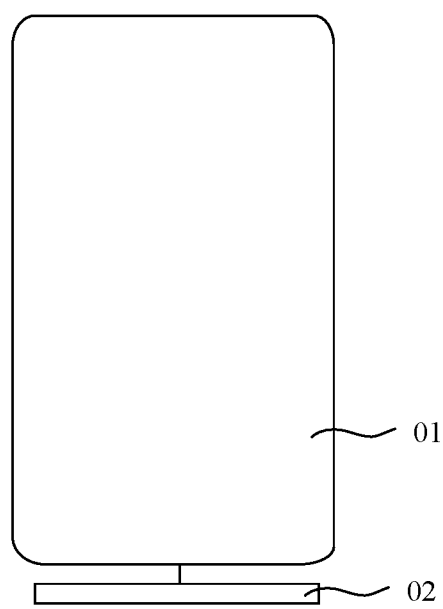
FIG. 15 is a schematic structural diagram of a display device according to an embodiment of the present disclosure.

FIG. 15 is a schematic structural diagram of a display device according to an embodiment of the present disclosure. Referring to FIG. 15, the display device may include a power supply 02 and a display panel 01. The power supply 02 is connected to the display panel 01, and is configured to supply power to the display panel 01. The display panel 01 may be the display substrate 10 according to the foregoing embodiments.

In some embodiments, the display device may be any product or component with a display function and a fingerprint recognition function, such as an OLED display device, a quantum dot light emitting diode (QLED) display device, electronic paper, a mobile phone, a tablet computer, a TV, a monitor, a notebook computer, a digital photo frame, or a navigator. The display device may be configured to display a video, a static image, or the like.

The display device in the embodiments of the present disclosure include the foregoing display substrate. The flatness of the planarization film 3 of the foregoing display substrate is optimized by using the lyophilic and lyophobic features and taking the shrinkage ratios of the planarization film 3 having different thicknesses into consideration. In this way, the uniformity of another film formed on the planarization film 3 is ensured, thereby ensuring that light emitted by the display device is uniform.

It should be noted that, in the description of this specification, the orientation or position relations indicated via terms of "upper," "lower," and the like are based on the orientation or position relations shown in the drawings, only to describe the present disclosure conveniently and simplify the description, but not indicate or imply that referred devices or elements must have particular orientations or be constructed and operated with the particular orientations, so that they cannot be construed as restrictions on the present disclosure. The terms "connected," "mounted," "fixed," and the like need to be broadly understood, for example, "connected" may be fixed connection, detachable connection, or integrated connection; or may be direct connection, or indirect connection via an intermediation. A person of ordinary skill in the art can understand the specific meaning of the above terms in the present disclosure in accordance with specific conditions.

The foregoing descriptions are merely exemplary embodiments of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A display substrate, comprising:
a base substrate;
a patterned film disposed on a side of the base substrate, wherein a surface, distal from the base substrate, of the patterned film is provided with a depressed portion and a non-depressed portion, a thickness of the depressed portion being less than a thickness of the non-depressed portion; and
a planarization film disposed on a side, distal from the base substrate, of the patterned film;
wherein lyophilicity of the depressed portion is higher than lyophilicity of the non-depressed portion.

2. The display substrate according to claim 1, wherein the planarization film comprises a first planarization layer and a second planarization layer that are sequentially laminated in a direction going away from the patterned film;
the first planarization layer is disposed in the depressed portion, an orthographic projection of the first planarization layer on the base substrate is not overlapped with an orthographic projection of the non-depressed portion on the base substrate, and a thickness of the first planarization layer is not greater than a depth of the depressed portion; and
an orthographic projection of the second planarization layer on the base substrate is overlapped with the orthographic projection of the non-depressed portion on the base substrate, and is overlapped with an orthographic projection of the depressed portion on the base substrate, wherein
lyophilicity of the first planarization layer is higher than lyophilicity of the second planarization layer.

3. The display substrate according to claim 2, wherein flatness of a surface, distal from the first planarization layer, of the second planarization layer is greater than flatness of a surface, distal from the base substrate, of the patterned film.

4. The display substrate according to claim 1, further comprising: a lyophobic layer, wherein the lyophobic layer is disposed between the non-depressed portion and the planarization film.

5. The display substrate according to claim 1, further comprising: a first electrode layer, a light-emitting layer, and a second electrode layer;
wherein the light-emitting layer emits light under driving of the first electrode layer and the second electrode layer.

6. The display substrate according to claim 5, wherein further comprising: a pixel define layer disposed on a side, distal from the base substrate, of the first electrode layer;
wherein the pixel define layer comprises a hollowed-out area, wherein the hollowed-out area exposes at least part of the first electrode layer, and the light-emitting layer is disposed in the hollowed-out area, and is in contact with the first electrode layer.

7. A method for preparing a display substrate, comprising:
forming a patterned film on a side of a base substrate, wherein a surface, distal from the base substrate, of the patterned film is provided with a depressed portion and a non-depressed portion, a thickness of the depressed portion being less than a thickness of the non-depressed portion; and
forming a planarization film on a side, distal from the base substrate, of the patterned film;
wherein lyophilicity of the depressed portion is higher than lyophilicity of the non-depressed portion.

8. The method according to claim 7, wherein forming the planarization film on the side, distal from the base substrate, of the patterned film comprises:
forming a first planarization layer in the depressed portion, wherein an orthographic projection of the first planarization layer on the base substrate is not overlapped with an orthographic projection of the non-depressed portion on the base substrate; and a thickness of the first planarization layer is not greater than a depth of the depressed portion; and
forming a second planarization layer on sides, distal from the patterned film, of the first planarization layer and the non-depressed portion, wherein an orthographic projection of the second planarization layer on the base substrate is overlapped with the orthographic projection of the non-depressed portion on the base substrate, and is overlapped with an orthographic projection of the depressed portion on the base substrate, wherein lyophilicity of the first planarization layer is higher than lyophilicity of the second planarization layer.

9. The method according to claim 8, wherein flatness of a surface, distal from the first planarization layer, of the second planarization layer is greater than flatness of a surface, distal from the base substrate, of the patterned film.

10. The method according to claim 8, wherein forming the first planarization layer in the depressed portion comprises:
forming a first planarization thin film on the surface, distal from the base substrate, of the patterned film;
acquiring a dried first planarization thin film by drying the first planarization thin film; and
acquiring the first planarization layer by removing the dried first planarization thin film on the non-depressed portion and retaining at least part of the dried first planarization thin film in the depressed portion.

11. The method according to claim 10, wherein forming the first planarization thin film on the surface, distal from the base substrate, of the patterned film comprises:
forming the first planarization thin film on the surface, distal from the base substrate, of the patterned film by slit coating, spin coating, or spray coating.

12. The method according to claim 8, wherein forming the first planarization layer in the depressed portion comprises:
forming a first planarization thin film in the depressed portion; and
acquiring the first planarization layer by drying the first planarization thin film.

13. The method according to claim 12, wherein forming the first planarization thin film in the depressed portion comprises:
forming the first planarization thin film in the depressed portion by printing.

14. The method according to claim 8, wherein forming the second planarization layer on the sides, distal from the patterned film, of the first planarization layer and the non-depressed portion comprises:
forming a second planarization thin film on the sides, distal from the patterned film, of the first planarization layer and the non-depressed portion, wherein an orthographic projection of the second planarization thin film on the base substrate is overlapped with the orthographic projection of the non-depressed portion on the base substrate, and is overlapped with the orthographic projection of the depressed portion on the base substrate; and
acquiring the second planarization layer by drying the second planarization thin film.

15. The method according to claim 14, wherein forming the second planarization thin film on the sides, distal from the patterned film, of the first planarization layer and the non-depressed portion comprises:
forming the second planarization thin film on surfaces, distal from the patterned film, of the first planarization layer and the non-depressed portion by slit coating, spin coating, or spray coating.

16. The method according to claim 7, wherein prior to forming the planarization film on the side, distal from the base substrate, of the patterned film, the method further comprises:
forming a lyophobic layer on a surface, distal from the base substrate, of the non-depressed portion.

17. The method according to claim 7, wherein upon forming the planarization film on the side, distal from the base substrate, of the patterned film, the method further comprises:
sequentially forming a first electrode layer, a light-emitting layer, and a second electrode layer on a side, distal from the patterned film, of the planarization film, wherein the light-emitting layer emits light under driving of the first electrode layer and the second electrode layer.

18. The method according to claim 17, wherein upon forming the first electrode layer, the method further comprises:
forming a pixel define layer on a side, distal from the planarization film, of the first electrode layer, wherein the pixel define layer comprises a hollowed-out area, wherein the hollowed-out area exposes at least part of the first electrode layer; and the light-emitting layer is disposed in the hollowed-out area, and is in contact with the first electrode layer.

19. A display panel, comprising: a drive circuit and a display substrate, wherein the drive circuit is configured to provide a drive signal for a sub-pixel in the display substrate; and the display substrate comprises:
a base substrate;
a patterned film disposed on a side of the base substrate, wherein a surface, distal from the base substrate, of the patterned film is provided with a depressed portion and a non-depressed portion, a thickness of the depressed portion being less than a thickness of the non-depressed portion; and
a planarization film disposed on a side, distal from the base substrate, of the patterned film;
wherein lyophilicity of the depressed portion is higher than lyophilicity of the non-depressed portion.

20. A display device, comprising: a power supply and the display panel according to claim 19;
wherein the power supply is configured to supply power to the display panel.

* * * * *